(12) United States Patent
Bellman et al.

(10) Patent No.: US 10,017,849 B2
(45) Date of Patent: Jul. 10, 2018

(54) HIGH RATE DEPOSITION SYSTEMS AND PROCESSES FOR FORMING HERMETIC BARRIER LAYERS

(71) Applicant: CORNING INCORPORATED, Corning, NY (US)

(72) Inventors: Robert Alan Bellman, Painted Post, NY (US); Ta-Ko Chuang, Painted Post, NY (US); Robert George Manley, Vestal, NY (US); Mark Alejandro Quesada, Horseheads, NY (US); Paul Arthur Sachenik, Corning, NY (US)

(73) Assignee: Corning Incorporated, Corning, NY (US)

( * ) Notice: Subject to any disclaimer, the term of this patent is extended or adjusted under 35 U.S.C. 154(b) by 514 days.

(21) Appl. No.: 13/840,752

(22) Filed: Mar. 15, 2013

(65) Prior Publication Data
US 2014/0144772 A1    May 29, 2014

Related U.S. Application Data

(60) Provisional application No. 61/731,226, filed on Nov. 29, 2012.

(51) Int. Cl.
*C23C 14/00* (2006.01)
*C23C 14/34* (2006.01)
*C23C 14/10* (2006.01)

(52) U.S. Cl.
CPC .............. *C23C 14/34* (2013.01); *C23C 14/10* (2013.01)

(58) Field of Classification Search
CPC ...... C23C 14/086; C23C 14/087; C23C 14/10; C23C 14/3435; C23C 14/0057
See application file for complete search history.

(56) References Cited

U.S. PATENT DOCUMENTS

| | | | |
|---|---|---|---|
| 3,850,604 A | 11/1974 | Klein | 65/32 |
| 5,089,446 A | 2/1992 | Cornelius et al. | 501/15 |

(Continued)

FOREIGN PATENT DOCUMENTS

| | | | | |
|---|---|---|---|---|
| EP | 1117502 | 1/2003 | ............ | B23K 26/00 |
| EP | 1880983 | 1/2008 | ............... | C03C 8/24 |

(Continued)

OTHER PUBLICATIONS

International Search Report and Written Opinion, dated May 23, 2014, International Filing No. PCT/US2013/071653, Dated Nov. 25, 2013.

(Continued)

*Primary Examiner* — Timon Wanga
(74) *Attorney, Agent, or Firm* — Russell S. Magaziner

(57) ABSTRACT

A method of forming a hermetic barrier layer comprises sputtering a thin film from a sputtering target, wherein the sputtering target includes a sputtering material such as a low $T_g$ glass, a precursor of a low $T_g$ glass, or an oxide of copper or tin. During the sputtering, the formation of defects in the barrier layer are constrained to within a narrow range and the sputtering material is maintained at a temperature of less than 200° C.

10 Claims, 15 Drawing Sheets

(56) References Cited

U.S. PATENT DOCUMENTS

| | | | |
|---|---|---|---|
| 5,561,742 A | 10/1996 | Terada et al. | |
| 6,086,727 A * | 7/2000 | Pinarbasi | H01J 37/3178 204/192.11 |
| 6,086,796 A * | 7/2000 | Brown et al. | 264/1.33 |
| 6,572,785 B2 | 6/2003 | Justel et al. | |
| 6,831,029 B2 | 12/2004 | Chacon et al. | 501/66 |
| 7,319,289 B2 | 1/2008 | Suehiro et al. | 313/485 |
| 7,615,506 B2 | 11/2009 | Aitken et al. | 501/44 |
| 7,722,929 B2 | 5/2010 | Aitken et al. | 427/376.1 |
| 7,749,811 B2 | 7/2010 | Aitken et al. | |
| 7,811,471 B2 | 10/2010 | Iwao et al. | 252/301.4 |
| 7,825,575 B2 | 11/2010 | Sawanobori et al. | 313/498 |
| 7,829,147 B2 | 11/2010 | Aitken et al. | 427/376.1 |
| 7,989,236 B2 | 8/2011 | Yamaguchi et al. | 428/26 |
| 8,206,613 B2 | 6/2012 | Fujita et al. | 252/301.4 |
| 8,344,404 B2 | 1/2013 | Fujita et al. | 257/98 |
| 8,435,605 B2 | 5/2013 | Aitken et al. | |
| 8,563,113 B2 | 10/2013 | Edwards et al. | |
| 2002/0128141 A1 | 9/2002 | Buhrmaster et al. | 501/45 |
| 2004/0040837 A1* | 3/2004 | McTeer et al. | 204/192.26 |
| 2004/0082145 A1 | 4/2004 | Reichenbach et al. | 438/455 |
| 2004/0175621 A1* | 9/2004 | Iriyama et al. | 429/231.95 |
| 2004/0206953 A1 | 10/2004 | Morena et al. | 257/40 |
| 2004/0207314 A1 | 10/2004 | Aitken et al. | 313/504 |
| 2007/0040501 A1 | 2/2007 | Aitken et al. | |
| 2008/0074029 A1 | 3/2008 | Suehiro | |
| 2008/0284315 A1 | 11/2008 | Tasumi et al. | 313/503 |
| 2009/0011217 A1* | 1/2009 | Ottermann et al. | 428/310.5 |
| 2009/0107834 A1* | 4/2009 | Ye et al. | 204/192.15 |
| 2009/0173960 A1 | 7/2009 | Martin et al. | 257/98 |
| 2009/0186433 A1 | 7/2009 | Yamaguchi et al. | 438/26 |
| 2009/0233800 A1 | 9/2009 | Huang et al. | |
| 2009/0309125 A1 | 12/2009 | Matsumoto et al. | |
| 2010/0190051 A1* | 7/2010 | Aitken et al. | 429/162 |
| 2010/0263723 A1 | 10/2010 | Allen et al. | 136/259 |
| 2010/0266787 A1 | 10/2010 | Yano et al. | |
| 2011/0017283 A1* | 1/2011 | Kampmann et al. | 136/252 |
| 2011/0256334 A1 | 10/2011 | Edwards et al. | 428/69 |
| 2012/0028011 A1 | 2/2012 | An et al. | |
| 2012/0057337 A1 | 3/2012 | Liebald et al. | |
| 2012/0074447 A1 | 3/2012 | Matsumoto et al. | |
| 2012/0160663 A1* | 6/2012 | Gillaspie | C23C 14/0057 204/192.15 |
| 2012/0293981 A1 | 11/2012 | Motoya et al. | 362/84 |
| 2013/0015761 A1 | 1/2013 | Motoya et al. | 313/512 |
| 2013/0049575 A1 | 2/2013 | Fujita et al. | 313/503 |
| 2013/0112650 A1 | 5/2013 | Karam et al. | 216/13 |

FOREIGN PATENT DOCUMENTS

| | | | |
|---|---|---|---|
| EP | 2036965 | 3/2009 | C09K 11/00 |
| EP | 2120271 | 11/2009 | H01L 33/50 |
| JP | 2003034550 | 2/2003 | |
| JP | 2003258308 | 9/2003 | |
| JP | 2006160599 | 6/2006 | |
| JP | 2008031001 | 2/2008 | |
| JP | 2008088046 | 4/2008 | |
| JP | 2008098147 | 4/2008 | |
| JP | 2008169348 | 7/2008 | C09K 11/08 |
| JP | 2012031328 | 2/2012 | C09K 11/00 |
| JP | 2012158494 | 8/2012 | C03C 8/04 |
| JP | 2012180488 | 9/2012 | C09K 11/00 |
| KR | 2009063408 | 6/2009 | |
| KR | 2010135223 | 12/2010 | H01L 33/48 |
| WO | WO2011013505 | 2/2011 | H01L 33/50 |
| WO | WO2011065322 | 6/2011 | H01L 33/56 |
| WO | WO2011111462 | 9/2011 | H01L 33/50 |
| WO | WO2012100132 | 7/2012 | C09K 11/08 |
| WO | WO2013001971 | 3/2013 | C03C 8/02 |

OTHER PUBLICATIONS

Van der Jagt, et al., Sputter deposition of TI$_2$SeAs$_2$Te$_3$ chalcogenide glass, *Journal of Vacuum Science & Technology A*, vol. 4, No. 2, Mar. 1, 1986, pp. 203-209.

Diez-Blanco et al; "Waveguide Structures Written in SF57 Glass With FS-Laser Pulses Above the Critical Self-Focusing Threshold"; Applied Surface Science; 252 (2006) 4523-4526.

Mueller-Mach et al; "Highly Efficient All-Nitride Phosphor-Converted White Light Emitting Diode"; Phys. Stat. Sol. (A) 2002, No. 9, 1727-1732, 2005.

Park et al; "Enhanced Luminescence Efficiency for Bi, Eu, Doped Y2O3 Red Phosphors for White LEDs"; Solid State Phenomena vols. 124-126 (2007) pp. 379-382.

Won et al; "Effect of Phosphor Geometry on the Luminous Efficiency of High-Power White Light-Emitting Diodes With Excellent Color Rendering Property"; Optics Letters; vol. 34, No. 1, Jan. 1, 2009, pp. 1-3.

Xie et al; "Rare-Earth Activated Nitride Phosphors: Synthesis, Luminescence and Applications"; Materials, 2010, 3, 3777-3793.

Xie et al; "Silicon-Based Oxynitride and Nitride Phosphors for White LEDs—A Review", Science and Technology of Advanced Materials, 8, (2007) 588-600.

CN201380071599.1 English Translation of First Office Action dated Nov. 22, 2016, China Patent Office.

TW102143266 Search Report dated May 10, 2017, Taiwan Patent Office.

Chung et al; "Effect of Low Energy Oxygen Ion Beam on Optical and Electrical Characteristics of Dual Ion Beam Sputtered SnO"2 Thin Films"; Thin Solid F, Elsevier Amsterdam NL, vol. 349, No. 1-2, Jul. 30, 1999; pp. 126-129.

EP17173036.9 Office Action dated Aug. 3, 2017; 8 Pages; European Patent Office.

* cited by examiner

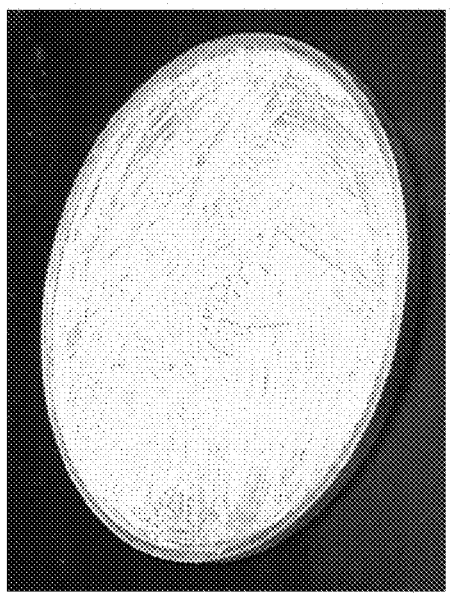
Fig. 16
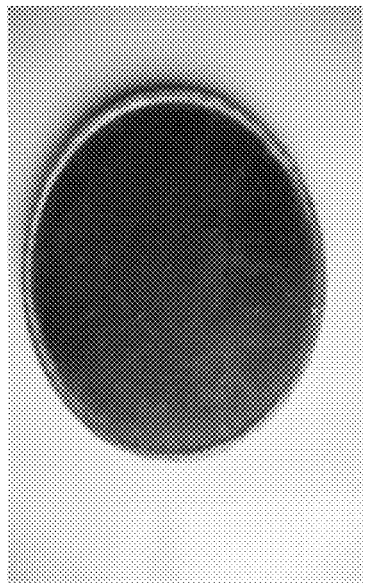
Fig. 18
Fig. 15
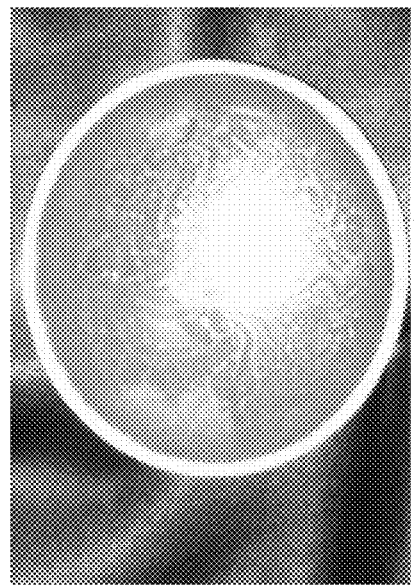
Fig. 17

HIGH RATE DEPOSITION SYSTEMS AND PROCESSES FOR FORMING HERMETIC BARRIER LAYERS

CROSS-REFERENCE TO RELATED APPLICATIONS

This application claims the benefit of priority under 35 U.S.C. § 119 of U.S. Provisional Application Ser. No. 61/731,226 filed on Nov. 29, 2012, the content of which is relied upon and incorporated herein by reference in its entirety.

BACKGROUND

The present disclosure relates generally to hermetic barrier layers, and more specifically to sputtering targets and high-throughput physical vapor deposition methods for forming hermetic barrier layers.

Hermetic barrier layers can be used to protect sensitive materials from deleterious exposure to a wide variety of liquids and gases. As used herein, "hermetic" refers to a state of being completely or substantially sealed, especially against the escape or entry of water or air, though protection from exposure to other liquids and gases is contemplated.

Approaches to creating hermetic barrier layers include physical vapor deposition (PVD) methods such as evaporation or sputtering, and chemical vapor deposition (CVD) methods such as plasma-enhanced CVD (PECVD). Using such methods, a hermetic barrier layer can be formed directly over the device or material to be protected. Alternatively, hermetic barrier layers can be formed on an intermediate structure such as a substrate or a gasket, which can cooperate with an additional structure to provide a hermetically-sealed workpiece.

Both reactive and non-reactive sputtering can be used to form a hermetic barrier layer, for instance, under room temperature or elevated temperature deposition conditions. Reactive sputtering is performed in conjunction with a reactive gas such as oxygen or nitrogen, which results in the formation of a corresponding compound barrier layer (i.e., oxide or nitride). Non-reactive sputtering can be performed using an oxide or nitride target having a desired composition in order to form a barrier layer having a similar or related composition.

On the one hand, reactive sputtering processes typically exhibit faster deposition rates than non-reactive processes, and thus may possess an economic advantage in certain methods. However, although increased throughput can be achieved via reactive sputtering, its inherently reactive nature may render such processes incompatible with sensitive devices or materials that require protection.

Economical sputtering materials, including sputtering targets that can be used to protect sensitive workpieces such as devices, articles or raw materials from undesired exposure to oxygen, water, heat or other contaminants are highly desirable.

SUMMARY

Disclosed herein are methods for preparing sputtering targets comprising low melting temperature (LMT) glass compositions and attendant methods for high-rate deposition of thin barrier layers exhibiting a self-passivating attribute. Operating conditions are selected to limit the surface temperature of the target during sputtering while providing for the formation of a deposited barrier layer having a small size as well as a small number density of individual defects such as pinholes. In embodiments, the number density and defect size is constrained to lie below a critical threshold.

In accordance with various embodiments, self-passivating barrier layers comprising low melting temperature glass compositions can be formed at relatively high throughput (high deposition rate) by, inter alia, lowering the sputtering chamber background pressure, precisely controlling the substrate and sputtering target temperature, sweeping the energy source (e.g., plasma) that engages the sputtering target, and limited the flux of sputtered material to a narrow angle.

A method of forming a hermetic barrier layer comprises providing a substrate and a sputtering target within a sputtering chamber, maintaining the sputtering material at less than 200° C., and sputtering the sputtering material with a power source to form a barrier layer comprising the sputtering material over a surface of the substrate. The sputtering target includes a sputtering material formed over a thermally conductive backing plate. The sputtering material may include a low $T_g$ glass, a precursor of a low $T_g$ glass, or an oxide of copper or tin.

The power source may include an ion source, a laser, plasma, a magnetron or combinations thereof. For example, the sputtering may comprise ion beam-assisted deposition. A further example may include a remote plasma generation sputter system that features independent (non-coupled) control of ion generation and density at the source, as well as control of the ion current, and voltage biasing to the target.

During formation of the barrier layer, the power source may be translated with respect to the sputtering target and/or the sputtering target may be rotated. In addition to maintaining the sputtering material at less than 200° C., the substrate may be maintained at less than 200° C. Hermetic barrier layers can be formed using the disclosed process at a deposition rate of at least 10 A/sec.

Sputter conditions are chosen to ensure the defect size and density distributions in the deposited layer are sufficiently small that defect diffusion paths can be effectively sealed upon exposure to moisture or oxygen. Sealing proceeds by virtue of the deposited layer's self-passivating attribute. We have shown that inorganic oxides exhibiting a molar volume expansion of from 1% to 15% upon reaction with water or oxygen are candidates for hermetic barrier layer formation.

Passivation may occur "passively" by simple exposure to ambient conditions, or "actively" by submerging the barrier layer in a water bath or exposing it to steam. The average defect size and density may be less than the expansion associated with the molar volume expansion of the as-deposited layer that accompanies passivation. Deposition conditions are used to ensure the defect size and density distributions within the barrier layer result in a population of void spaces that can be sealed from the molar volume expansion.

Additional features and advantages will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

BRIEF DESCRIPTION OF THE DRAWINGS

FIG. 15 is a photograph of a copper backing plate according to various embodiments;

FIG. 16 is a photograph of a solder-coated copper backing plate;

FIG. 17 is an image of an example sputtering target comprising an annealed low $T_g$ glass material;

FIG. 18 in an image of a pressed low $T_g$ glass sputtering target;

DETAILED DESCRIPTION

Figure 1:
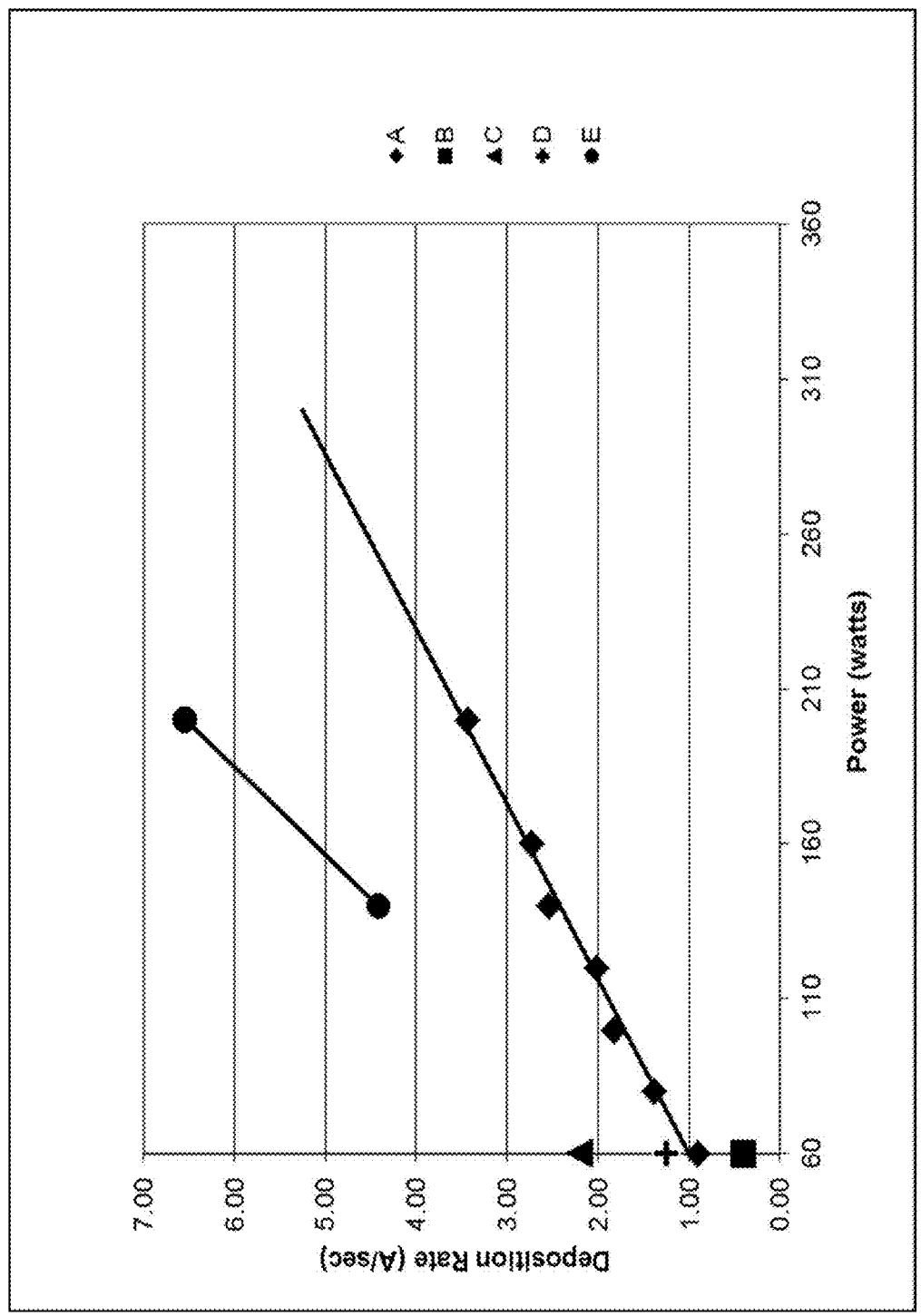
FIG. 1 is a plot of magnetron sputter deposition rate versus power.

Mechanically-stable hermetic barrier layers can be formed by physical vapor deposition (e.g., sputter deposition or laser ablation) of a suitable starting material directly onto a workpiece or onto a substrate that can be used to encapsulate a workpiece. The starting materials include low $T_g$ glass materials and their precursors, as well as polycrystalline or amorphous oxides of copper or tin. As defined herein, a low $T_g$ glass material has a glass transition temperature of less than 400° C., e.g., less than 350, 300, 250 or 200° C.

In embodiments, the number and size distribution of defects that may be formed within the hermetic barrier layers are constrained to a narrow specified range. By limiting the population of defects, the as-formed layers through a self-passivation mechanism can effectively compensate for such defects during exposure to air or moisture and form a hermetic layer.

Example processes for forming hermetic barrier layers include ion beam sputtering, magnetron sputtering, laser ablation, remote plasma generation high target utilization sputtering (HiTUS) and ion beam-assisted deposition (IBAD). Ion beam-assisted deposition is a combination of two distinct physical operations, physical vapor deposition of a target material onto a substrate and simultaneous bombardment of the substrate surface with an ion beam. Each of the foregoing approaches can be implemented in a batch or continuous, e.g., roll-to-roll process. With each of these techniques, the deposition rate of the barrier layer (low melting temperature glass) material can be increased by increasing the energy or flux of the corresponding ion or photon source. However, such a pedestrian approach does not ensure that the defect population within the formed layer will enable successful formation of a hermetic barrier layer.

Embodiments relate to high-rate (e.g., greater than 10 A/sec) deposition of the hermetic barrier layers. The deposition rate can be, for example, at least 10, 20, 50 or 100 A/sec. High-rate deposition of hermetic barrier layers can be successfully carried out by limiting the temperature of the target during deposition, e.g., to less than 200° C., and by constraining the defect number and size distribution contributing to the barrier layer's void space to be lower than what can be sealed from the molar volume expansion accompanying passivation.

According to embodiments, hermetic barrier layers can be formed using ion beam deposition processes. The ion beam-derived layers can exhibit defect densities on the order of $2 \times 10^{-2}/cm^2$, which can be up to five orders of magnitude less than the defect densities associated with most magnetron sputtering approaches. Beneficial aspects of the ion beam deposition approach, particularly in comparison to magnetron sputtering, include a more directional flux (e.g., near normal incidence), lower chamber background pressure, higher mean free path, and the ability to independently adjust the ion flux energy and power. Near-normal ion beam sputtering conditions have been demonstrated to reduce the size of defects up to an order of magnitude over off-normal sputtering conditions.

In the case of magnetron sputtering, a dominant source of particle contamination is related to the finite cross-section of the sputtering target surface that is exposed to weaker plasma density. This non-homogeneous plasma density can cause the formation, migration and mechanical ejection of filaments or nodules (defects) from the target during deposition. Such a defect-formation mechanism is undesirably exacerbated by applying higher ion sputtering gas densities.

In embodiments, magnetron sputtering can be used to form high deposition rate, high throughput, low defect density hermetic barrier layers by, for instance, limiting the angular components of the deposition process, for example through baffling, and/or by using grounding grids in the deposition chamber.

In a similar vein, in the case of laser ablation, the ejection of particulates with significant size occurs when the photon flux is high enough to induce explosive ablation. When this occurs, a highly-directed forward jet of target material accompanies a broad-angle plume. The plume typically contains many fine particles, from ~0.01 μm to 10 μm, which are ejected directly from the target surface.

In embodiments, the hermetic barrier layers are formed by a non-equilibrium deposition process and have a defect size and distribution where the volume in the layer occupied by as-deposited defects is less than 15% of the total film volume after self-passivation.

In conjunction with the instant methods, also disclosed are approaches for preparing sputtering targets and associated processing conditions for forming hermetic barrier layers from a class of low melting temperature (i.e., low $T_g$) glass compositions. The barrier layers exhibit a self-passivating attribute that results in layer that is hermetic to water and oxygen.

Modeled data indicate that high-rate deposition can be achieved by maintaining the sputtering target surface temperature below 200° C., e.g., below 180° C. or 160° C. during deposition. The target temperature can be controlled, for example, by sweeping processing plasma over a large area of the target surface. Swept plasma limits the thermal load to any one given target location despite a higher applied power and/or higher ion flux, which can be used to accelerate the deposition rate. Swept plasma may also result in better target utilization, with more of the target material consumed in film formation. In contrast to the disclosed approach, sputtering target surface temperatures that exceed 200° C. usually accompany a catastrophic failure of the target, e.g., fracture of the target material, delamination from the backing plate and/or evidence of significant chemical attack.

Sweeping the plasma over the target surface can be performed while actively cooling the target using, for example, a moving magnet, rotating cylinder, or similar design. Ion beam flux designs may similarly employ sweeping beams over cooled glass targets. During the sputtering process, which is carried out within a vacuum chamber, an internal pressure of the chamber can be less than $10^{-3}$ Torr, e.g., less than $1 \times 10^{-3}$, $5 \times 10^{-4}$ or $1 \times 10^{-4}$ Torr.

FIG. 1 is a plot of magnetron sputter deposition rate versus power for a sputtering target comprising a low $T_g$ tin fluorophosphate glass. The data show results from swept plasma (curve A) over a cooled (180-200° C.) sputter target as well as for a static, immobile plasma (curves B-E).

Figure 2:
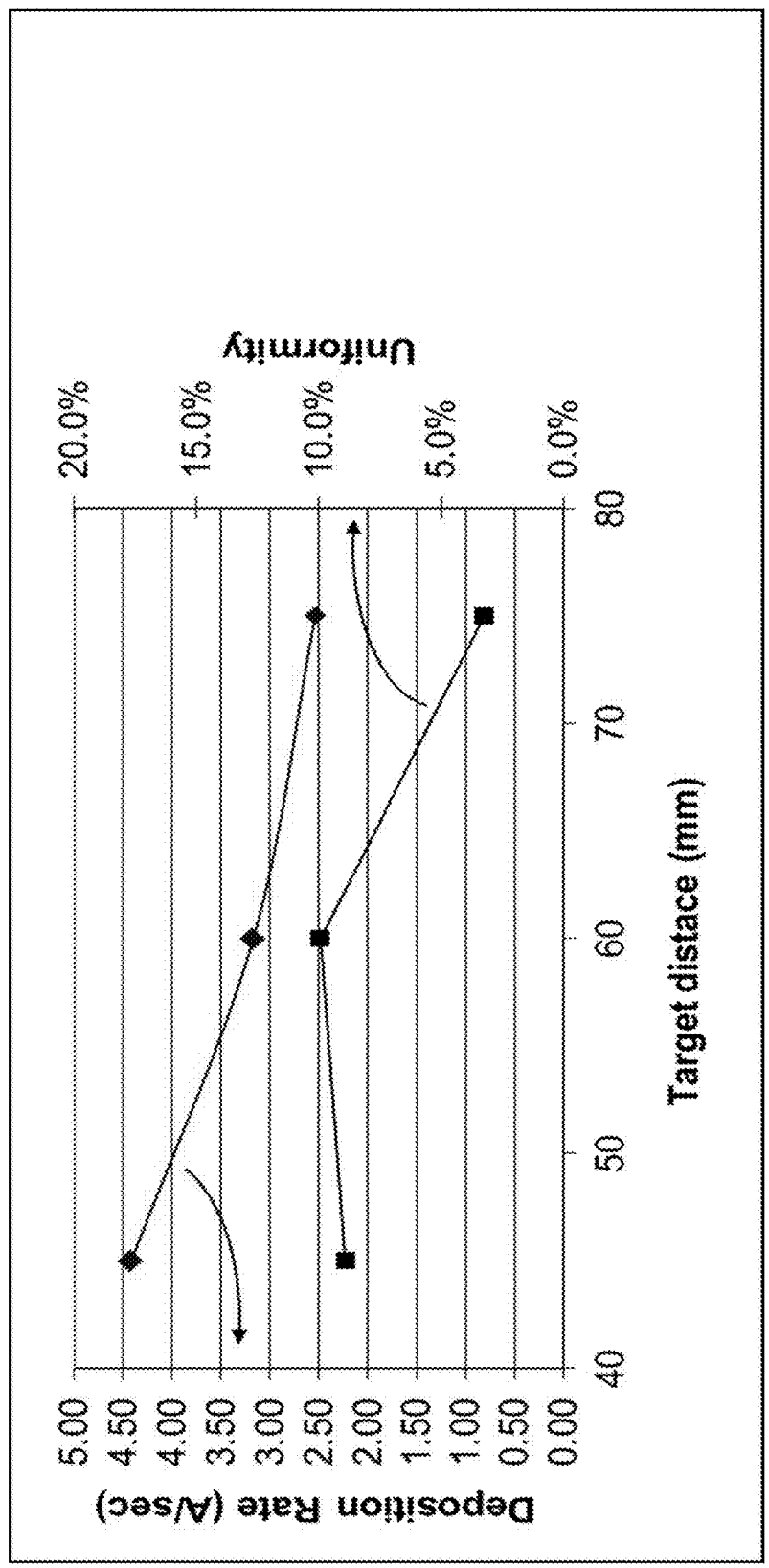
FIG. 2 is a plot of magnetron sputter deposition rate and barrier layer uniformity versus substrate-target distance.

FIG. 2 is a plot of magnetron sputter deposition rate and barrier layer uniformity versus distance from the substrate to the target for a swept plasma over a cooled (180-200° C.) sputter target at 140 W. With reference to FIG. 2, it can be observed that sputter deposition rate decreases as target distance increases. It can also be observed that barrier layer uniformity increases from a target distance of about 45 mm to 60 mm and then decreases from a target distance of 60 mm to about 75 mm.

Suitable deposition methods include non-equilibrium processes such as ion beam sputtering, magnetron sputtering, and laser ablation. Such non-equilibrium processes can be used to ensure sufficient volumetric swelling of the barrier layer material, but limit the expansion to less than 15%, e.g., less than 10%. By limiting the number and size distribution of defects within the barrier layer to a narrow range, the volumetric expansion of the material that occurs through reaction with moisture can effectively pinch off pores and other defects to form a self-passivated, hermetic barrier layer.

A variety of deposition apparatus can be used to form the hermetic barrier layers. In accordance with an example embodiment, a single-chamber sputter deposition apparatus 100 for forming such barrier layers is illustrated schematically in FIG. 3. While the apparatus and attendant methods are described below with respect to deposition onto a substrate, it will be appreciated that the substrate may be replaced by a workpiece or other device that is to be protected by the barrier layer.

Apparatus 100 includes a vacuum chamber 105 having a substrate stage 110 onto which one or more substrates 112 can be mounted, and a mask stage 120, which can be used to mount shadow masks 122 for patterned deposition of different layers onto the substrates. The chamber 105 is equipped with a vacuum port 140 for controlling the interior pressure, as well as a water cooling port 150 and a gas inlet port 160. The vacuum chamber can be cryo-pumped (CTI-8200/Helix; Mass., USA) and is capable of operating at pressures suitable for both evaporation processes (~$10^{-6}$ Torr) and RF sputter deposition processes (~$10^{-3}$ Torr).

Figure 3:
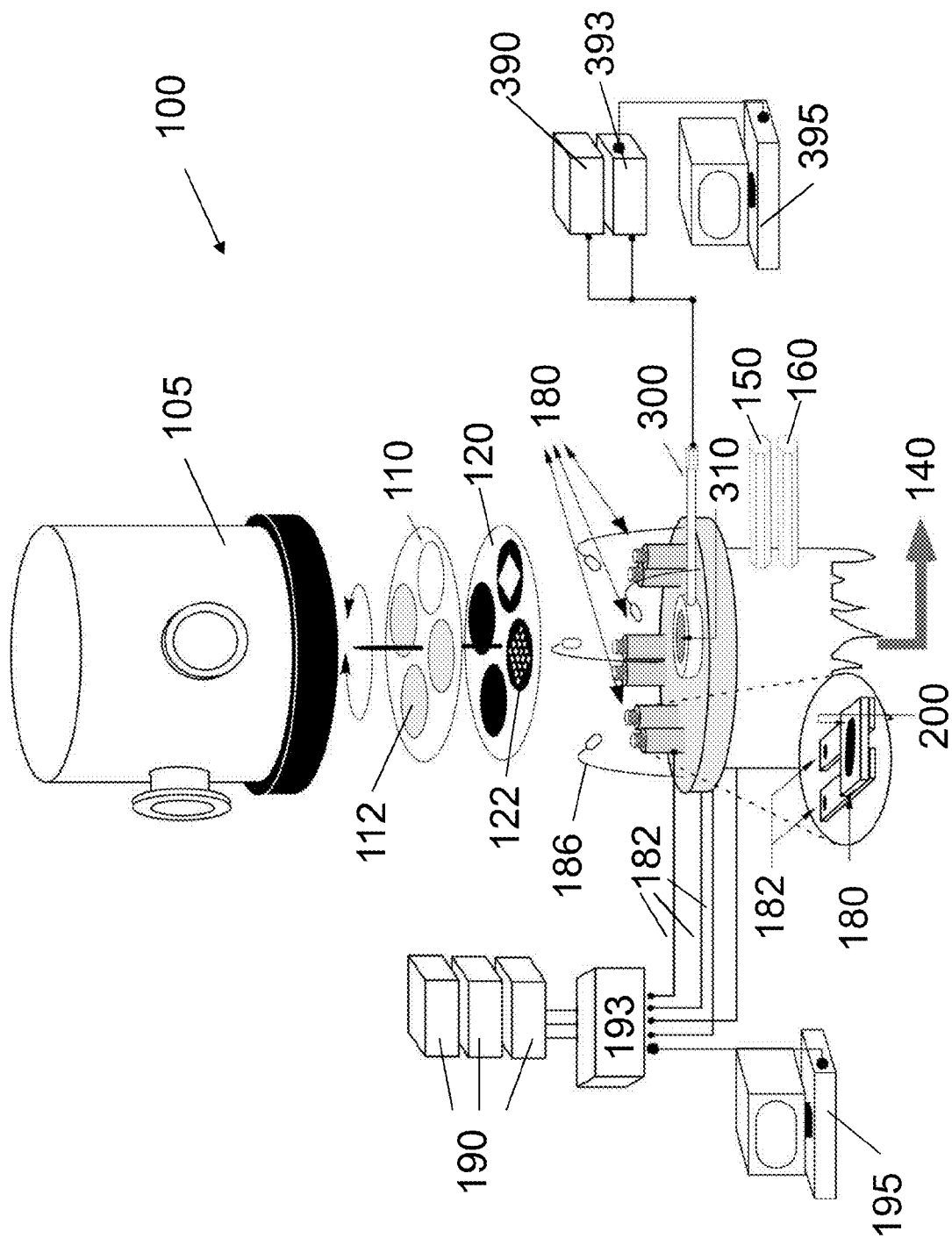
FIG. 3 is a schematic diagram of a single chamber sputter tool for forming hermetic barrier layers.

As shown in FIG. 3, multiple evaporation fixtures 180, each having an optional corresponding shadow mask 122 for evaporating material onto a substrate 112, are connected via conductive leads 182 to a respective power supply 190. A target material 200 to be evaporated can be placed into each fixture 180. Thickness monitors 186 can be integrated into a feedback control loop including a controller 193 and a control station 195 in order to affect control of the amount of material deposited.

In an example system, each of the evaporation fixtures 180 are outfitted with a pair of copper leads 182 to provide DC current at an operational power of about 80-180 Watts. The effective fixture resistance will generally be a function of its geometry, which will determine the precise current and wattage.

An RF sputter gun 300 having a sputtering target 310 is also provided for forming a barrier layer on a substrate. The RF sputter gun 300 is connected to a control station 395 via an RF power supply 390 and feedback controller 393. For sputtering inorganic, hermetic layers, water-cooled cylindrical RF sputtering guns (Onyx-3™, Onyx-R™, Angstrom Sciences, Pa.) can be positioned within the chamber 105. Suitable RF deposition conditions include 50-150 W forward power (<1 W reflected power), which corresponds to a typical deposition rate of about ~5 Å/second (Advanced Energy, Co, USA).

A post-deposition sintering or annealing step of the as-deposited material may be performed or omitted. An optional annealing step can reduce internal stresses within the barrier layer.

In general, suitable materials for forming hermetic barrier layers include low $T_g$ glasses and suitably reactive oxides of copper or tin. Hermetic barrier layers can be formed from low $T_g$ materials such as phosphate glasses, borate glasses, tellurite glasses and chalcogenide glasses. Example borate and phosphate glasses include tin phosphates, tin fluorophosphates and tin fluoroborates. Sputtering targets can include such glass materials or, alternatively, precursors thereof. Example copper and tin oxides are CuO and SnO, which can be formed from sputtering targets comprising pressed powders of these materials.

Optionally, the compositions can include one or more dopants, including but not limited to tungsten, cerium and niobium. Such dopants, if included, can affect, for example, the optical properties of the barrier layer, and can be used to control the absorption by the barrier material of electromagnetic radiation, including laser radiation. For instance, doping with ceria can increase the absorption by a low $T_g$ glass barrier at laser processing wavelengths, which can enable the use of laser-based sealing techniques after formation on a substrate or gasket.

Example tin fluorophosphate glass compositions can be expressed in terms of the respective compositions of SnO, $SnF_2$ and $P_2O_5$ in a corresponding ternary phase diagram. Suitable tin fluorophosphates glasses include 20-100 mol % SnO, 0-50 mol % $SnF_2$ and 0-30 mol % $P_2O_5$. These tin fluorophosphates glass compositions can optionally include 0-10 mol % $WO_3$, 0-10 mol % $CeO_2$ and/or 0-5 mol % $Nb_2O_5$.

For example, a composition of a doped tin fluorophosphate starting material suitable for forming a hermetic barrier layer comprises 35 to 50 mole percent SnO, 30 to 40 mole percent $SnF_2$, 15 to 25 mole percent $P_2O_5$, and 1.5 to 3 mole percent of a dopant oxide such as $WO_3$, $CeO_2$ and/or $Nb_2O_5$.

A tin fluorophosphate glass composition according to one particular embodiment is a niobium-doped tin oxide/tin fluorophosphate/phosphorus pentoxide glass comprising about 38.7 mol % SnO, 39.6 mol % $SnF_2$, 19.9 mol % $P_2O_5$ and 1.8 mol % $Nb_2O_5$. Sputtering targets that can be used to form such a glass layer may include, expressed in terms of atomic mole percent, 23.04% Sn, 15.36% F, 12.16% P, 48.38% O and 1.06% Nb.

A tin phosphate glass composition according to an alternate embodiment comprises about 27% Sn, 13% P and 60% O, which can be derived from a sputtering target comprising, in atomic mole percent, about 27% Sn, 13% P and 60% O. As will be appreciated, the various glass compositions disclosed herein may refer to the composition of the deposited layer or to the composition of the source sputtering target.

As with the tin fluorophosphates glass compositions, example tin fluoroborate glass compositions can be expressed in terms of the respective ternary phase diagram compositions of SnO, $SnF_2$ and $B_2O_3$. Suitable tin fluoroborate glass compositions include 20-100 mol % SnO, 0-50 mol % $SnF_2$ and 0-30 mol % $B_2O_3$. These tin fluoroborate glass compositions can optionally include 0-10 mol % $WO_3$, 0-10 mol % $CeO_2$ and/or 0-5 mol % $Nb_2O_5$.

Figure 4:
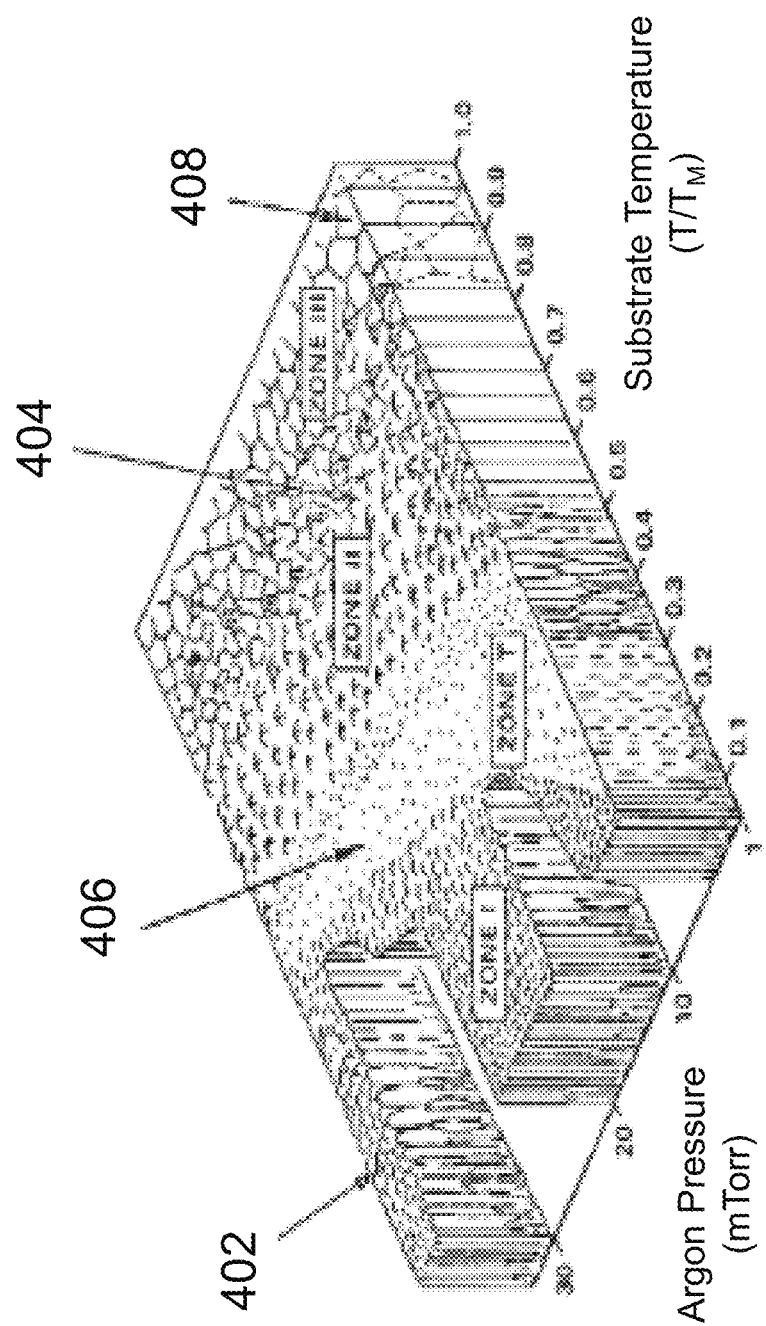
FIG. 4 is a Thornton diagram depicting various barrier layer microstructures.

Typical prescriptions for managing thin film structure, including the number and size of defects associated with thin film deposition, are illustrated with a Thornton diagram (see FIG. 4). The Thornton diagram shows deposited thin film morphological regions arising from different sputtering gas pressure and substrate temperature conditions, where microstructure is segmented into zone I, zone T, zone II, and zone III morphologies. These zones arise from different sputtering gas pressure and substrate temperature conditions. Zone I films (low $T_S$, high $P_G$) typically exhibit a microstructure of columnar crystallites 402 with voids in between the columns while zone II (high $T_S$) exhibits a microstructure of columnar grains 404 separated by distinct dense inter-crystalline boundaries. Zone T (low $T_S$, low $P_G$) is a transition zone in between zone I and II consisting of a poorly-defined dense array of fibrous grains 406 without voided boundaries. A recrystallized grain structure 408 is illustrated in Zone III.

Due to their relatively low melting temperature and chemical liability, process conditions and the resulting layers that include the glass compositions disclosed herein exhibit significant deviation from typical refractory materials. For instance, applicants have shown that the self-passivating character of tin-containing glass compositions can be correlated to the $Sn^{2+}$ (i.e., SnO) content within the formed layer. Data show that the $Sn^{2+}$ content is a function of the substrate temperature, and that $Sn^{2+}$ rich layers can be formed by cooling the substrate during deposition. At higher substrate temperatures, lower amounts of $Sn^{2+}$ are incorporated into the barrier layer due to the loss of $PO_xF_y$ and $SnF_x$ species at the expense of $Sn^{4+}$ (i.e., $SnO_2$). Thin film layers that incorporate a large fraction of $Sn^{4+}$ do not readily self-passivate and therefore do not form effective barrier layers.

During formation of the barrier layer, the substrate can be maintained at a temperature less than 200° C., e.g., less than 200, 150, 100, 50 or 23° C. In embodiments, the substrate is cooled to a temperature less than room temperature during deposition of the barrier layer. The target temperature as well as the substrate temperature can be controlled in both ion-beam deposition processes and magnetron sputter deposition processes.

Figure 5:
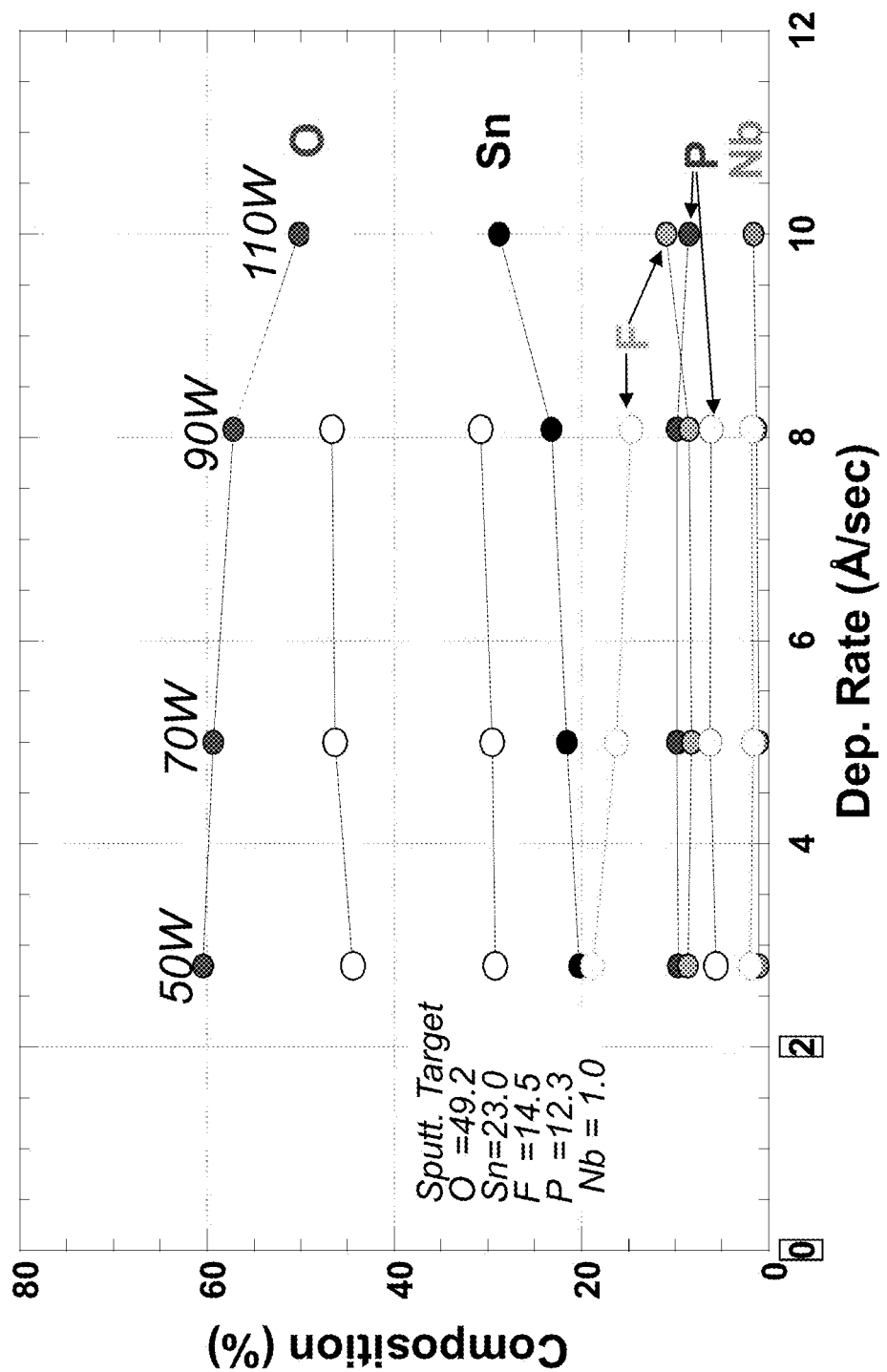
FIG. 5 is a plot of barrier layer composition versus deposition rate for different magnetron sputtering conditions.

FIG. 5 is a plot of barrier layer composition (wt. %) versus deposition rate (A/sec) for increasing values of magnetron sputter power (50, 70, 90 or 110 Watts). The initial sputtering target composition included 49.2 wt. % oxygen, 23.0 wt. % tin, 14.5 wt. % fluorine, 12.3 wt. % phosphorus and 1.0 wt. % Nb. The filled data points correspond to a substrate temperature of 45° C., while the open data points correspond to a substrate temperature of 15° C. The sputtering target temperature was maintained less than 200° C.

Figure 6:
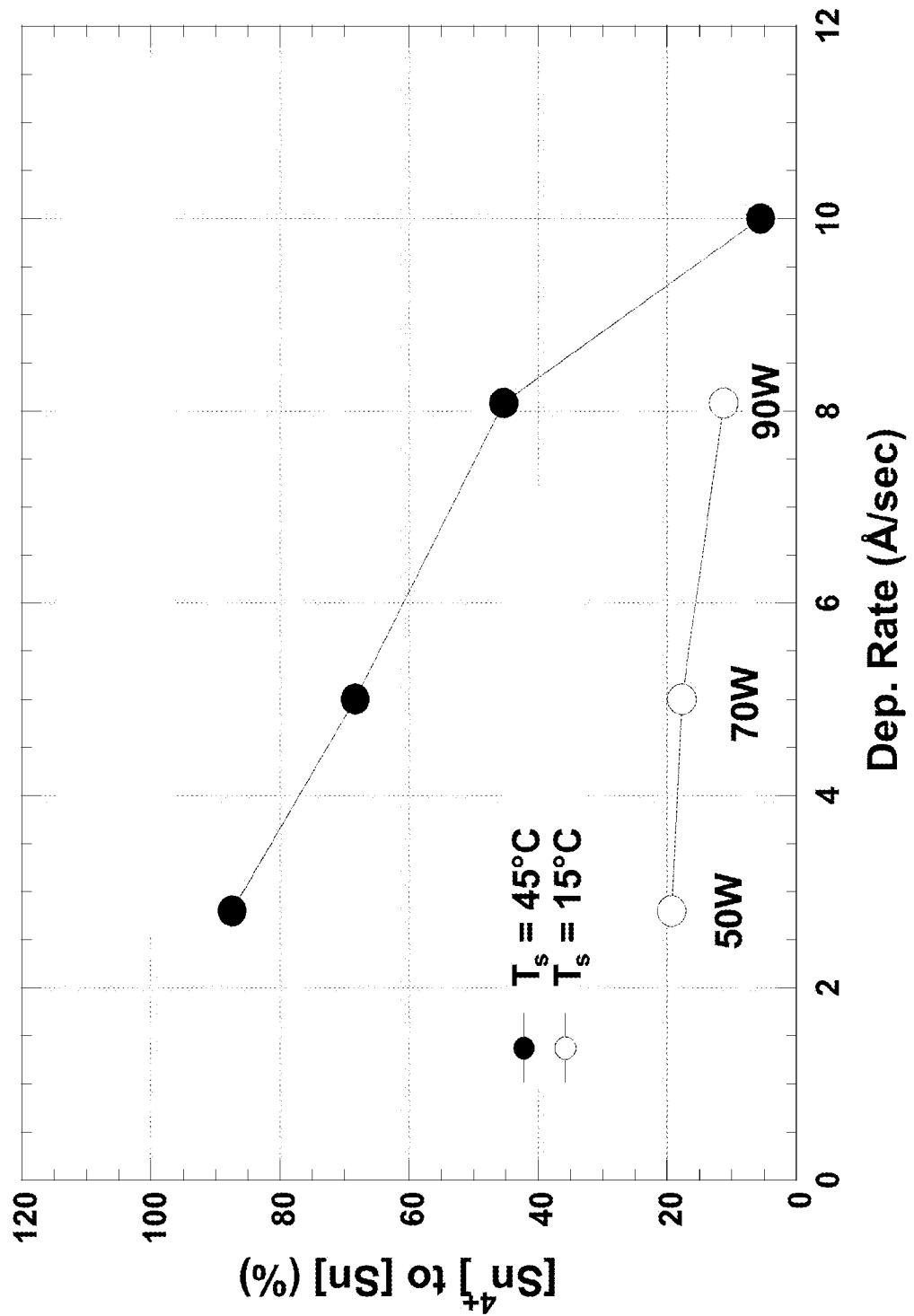
FIG. 6 is a plot of $Sn^{4+}$ content versus deposition rate for a niobium-doped tin fluorophosphate glass material.

FIG. 6 is a corresponding plot of percentage $Sn^{4+}$ (i.e., $Sn^{4+}$/total Sn content) versus deposition rate. As with FIG. 5, the filled data points correspond to a substrate temperature of 45° C., while the open data points correspond to a substrate temperature of 15° C. The FIG. 6 data clearly show that the $Sn^{4+}$ content in the barrier layers can be advantageously suppressed by cooling the substrate.

Additional aspects of suitable low $T_g$ glass compositions and methods used to form glass layers from these materials are disclosed in commonly-assigned U.S. Pat. No. 5,089,446 and U.S. patent application Ser. Nos. 11/207,691, 11/544, 262, 11/820,855, 12/072,784, 12/362,063, 12/763,541 and 12/879,578, the entire contents of which are incorporated by reference herein.

The hermetic barrier layer materials disclosed herein may comprise a binary, ternary or higher-order composition. A survey of several binary oxide systems reveals other materials capable of forming self-passivating hermetic barrier layers. In the copper oxide system, for example, as-deposited amorphous CuO reacts with moisture/oxygen to partially form crystalline $Cu_4O_3$ and the resulting composite layer exhibits good hermeticity. When $Cu_2O$ is deposited as the first inorganic layer, however, the resulting film is not hermetic. In the tin oxide system, as-deposited amorphous SnO reacts with moisture/oxygen to partially form crystalline $Sn_6O_4(OH)_4$ and $SnO_2$. The resulting composite layer exhibits good hermeticity. When $SnO_2$ is deposited as the first inorganic layer, however, the resulting film is not hermetic.

Figure 7:
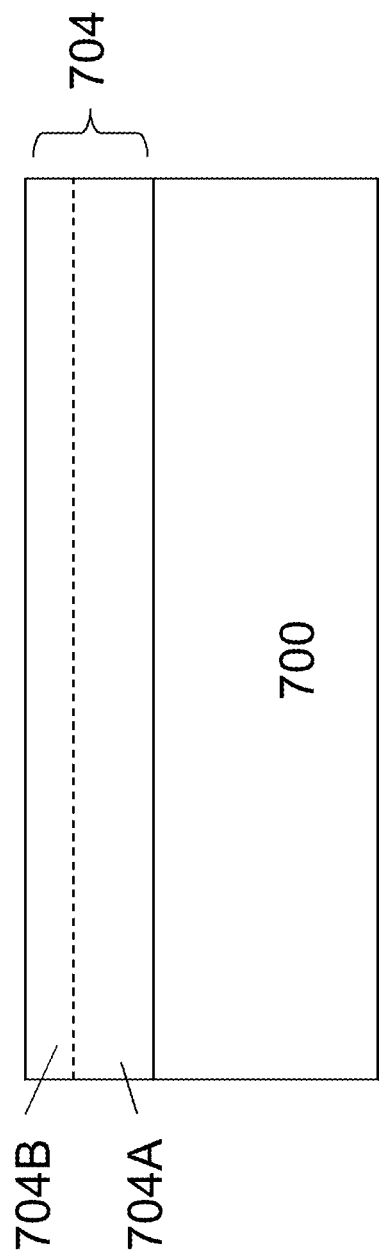
FIG. 7 is an illustration of a hermetic barrier layer formed over a surface of a substrate.

According to various sputtering approaches, a self-passivating layer can be formed on a surface of a substrate or workpiece from a suitable target material. The self-passivating layer is an inorganic material. Without wishing to be bound by theory, it is believed that, according to various embodiments, during or after its formation, the as-deposited layer reacts with moisture or oxygen to form a mechanically-stable hermetic barrier layer. The hermetic barrier layer comprises the as-deposited layer and a second inorganic layer, which is the reaction product of the deposited layer with moisture or oxygen. Thus, the second inorganic layer forms at the ambient interface of the as-deposited layer. A schematic of a hermetic barrier layer 704 formed over a surface of a substrate 700 is illustrated in FIG. 7. In the illustrated embodiment, the hermetic barrier layer 704 comprises a first (as-deposited) inorganic layer 704A, and a second (reaction product) inorganic layer 704B. In embodiments, the first and second layers can cooperate to form a composite thin film that can isolate and protect an underlying structure. The passivatable as-deposited layer comprises a low $T_g$ glass material or an oxide of copper or tin.

According to further embodiments, a molar volume of the passivated second inorganic layer material is from about 1% to 15% greater than a molar volume of the first inorganic layer material, and an equilibrium thickness of the second inorganic layer is at least 10% of but less than an initial thickness of the first inorganic layer. While the first inorganic layer can be amorphous, the second inorganic layer can be at least partially crystalline.

In embodiments, the molar volume change (e.g., increase) manifests as a compressive force within the composite barrier layer that contributes to a self-sealing phenomenon. Because the second layer is formed as the spontaneous reaction product of the first inorganic layer with oxygen or water, as-deposited layers (first inorganic layers) that successfully form hermetic barrier layers are less thermodynamically stable than their corresponding second inorganic layers. Thermodynamic stability is reflected in the respective Gibbs free energies of formation.

The hermetic barrier layers disclosed herein may be characterized as thin film materials. A total thickness of a hermetic barrier layer can range from about 150 nm to 200 microns. In various embodiments, a thickness of the as-deposited layer can be less than 200 microns, e.g., less than 200, 100, 50, 20, 10, 5, 2, 1, 0.5 or 0.2 microns. Example thicknesses of as-deposited glass layers include 200, 100, 50, 20, 10, 5, 2, 1, 0.5, 0.2 or 0.15 microns.

Hermetic barrier layers formed by physical vapor deposition according to the present disclosure may exhibit a self-passivating attribute that efficiently and significantly impedes moisture and oxygen diffusion.

According to embodiments, the choice of the hermetic barrier layer material(s) and the processing conditions for forming hermetic barrier layers over a workpiece or substrate are sufficiently flexible that the workpiece or substrate is not adversely affected by formation of the barrier layer.

Figure 9:
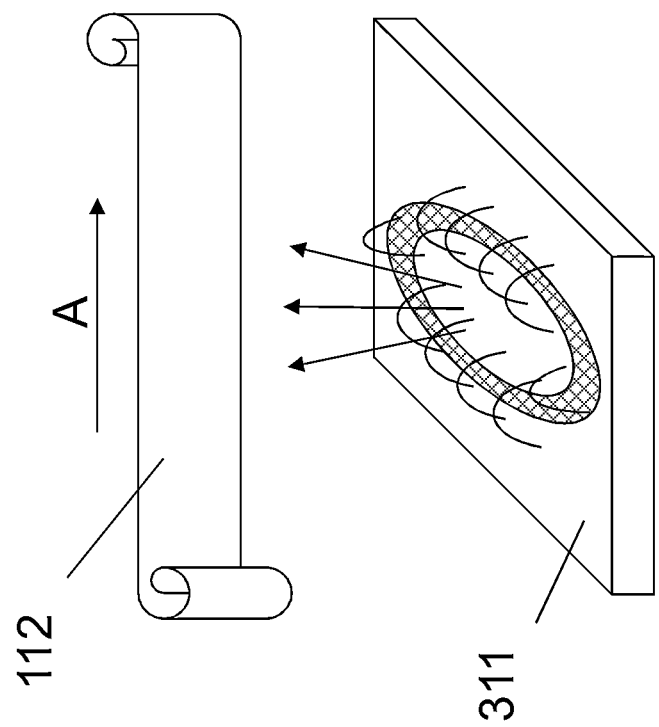
FIG. 9 depicts a portion of a continuous in-line magnetron sputtering apparatus according to a further example embodiment.
Figure 8:
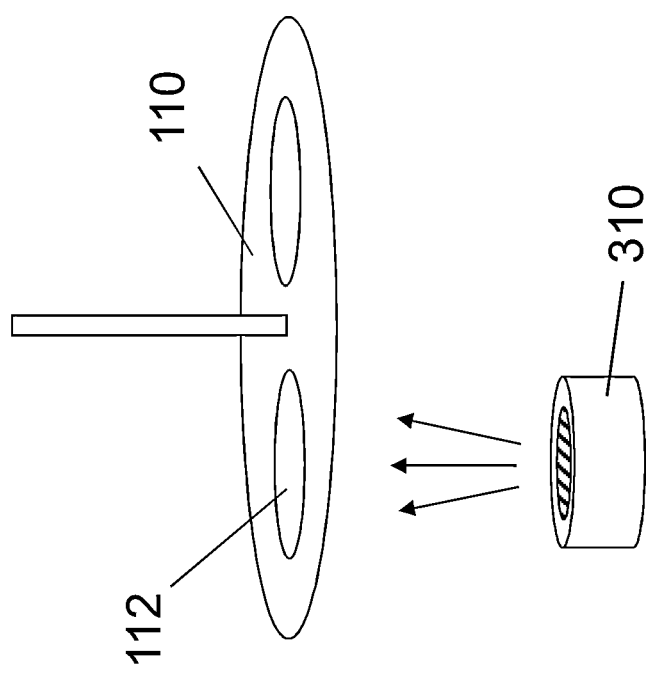
FIG. 8 depicts a portion of an RF sputtering apparatus according to an example embodiment.

Example sputtering configurations according to various embodiments are illustrated in FIGS. 8 and 9. FIG. 8 shows RF sputtering from a sputtering target 310 to form a barrier layer on a substrate 112 that is supported by a rotating substrate stage 110 as also depicted in FIG. 3. FIG. 9 shows a portion of an in-line planar magnetron sputtering apparatus configured to continuously form a hermetic barrier layer on a surface of a translating substrate. A direction of motion of the substrate is shown in FIG. 9 by arrow A. The pristine substrate can be unwrapped from a first roll, passed over a deposition zone of the magnetron sputtering target 311 to provide a barrier layer on a portion of the workpiece, and then the coated workpiece can be wrapped onto a second roll.

A hermetic layer is a layer which, for practical purposes, is considered substantially airtight and substantially impervious to moisture and/or oxygen. By way of example, the hermetic thin film can be configured to limit the transpiration (diffusion) of oxygen to less than about $10^{-2}$ $cm^3/m^2/day$ (e.g., less than about $10^{-3}$ $cm^3/m^2/day$), and limit the transpiration (diffusion) of water to about $10^{-2}$ $g/m^2/day$ (e.g., less than about $10^{-3}$, $10^{-4}$, $10^{-5}$ or $10^{-6}$ $g/m^2/day$). In embodiments, the hermetic thin film substantially inhibits air and water from contacting an underlying workpiece or a workpiece sealed within a structure using the hermetic material.

To evaluate the hermeticity of the hermetic barrier layers, calcium patch test samples were prepared using the single-chamber sputter deposition apparatus 100. In a first step, calcium shot (Stock #10127; Alfa Aesar) was evaporated through a shadow mask 122 to form 25 calcium dots (0.25 inch diameter, 100 nm thick) distributed in a 5×5 array on a 2.5 inch square glass substrate. For calcium evaporation, the chamber pressure was reduced to about $10^{-6}$ Torr. During an initial pre-soak step, power to the evaporation fixtures 180 was controlled at about 20 W for approximately 10 minutes, followed by a deposition step where the power was increased to 80-125 W to deposit about 100 nm thick calcium patterns on each substrate.

Following evaporation of the calcium, the patterned calcium patches were encapsulated using comparative inorganic oxide materials as well as hermetic inorganic oxide materials according to various embodiments. The inorganic oxide materials were deposited using room temperature RF sputtering of pressed powder or glass sputtering targets. The pressed powder targets were prepared separately using a manual heated bench-top hydraulic press (Carver Press, Model 4386, Wabash, Ind., USA). The press was typically operated at 5,000 psi for 2 hours at about 200° C.

The RF power supply 390 and feedback control 393 (Advanced Energy, Co, USA) were used to form first inorganic oxide layers over the calcium having a thickness of about 2 micrometers. No post-deposition heat treatment was used. Chamber pressure during RF sputtering was about 1 milliTorr. The formation of a second inorganic layer over the first inorganic layer was initiated by ambient exposure of the test samples to room temperature and atmospheric pressure prior to testing.

Figure 10:
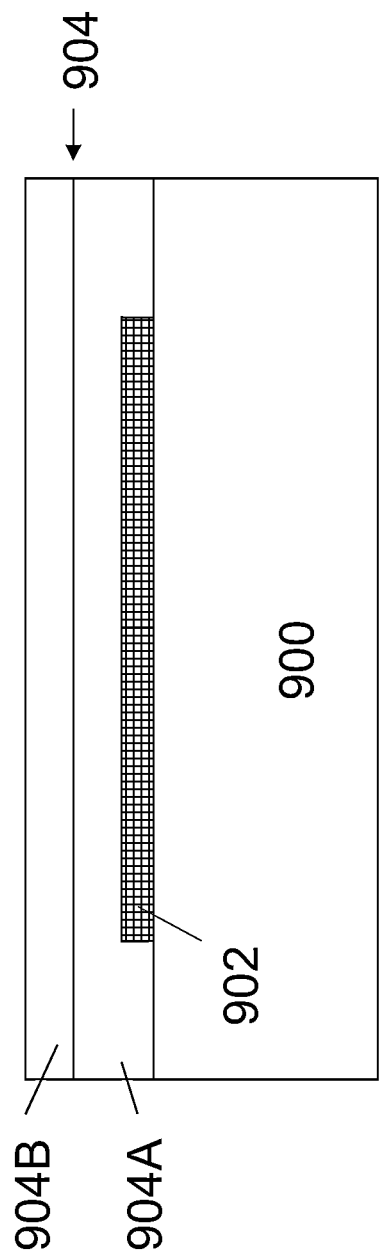
FIG. 10 in an illustration of a calcium-patch test sample for accelerated evaluation of hermeticity.

FIG. 10 is a cross-sectional view of a test sample comprising a glass substrate 900, a patterned calcium patch (~100 nm) 902, and an inorganic oxide film (~2 μm) 904. Following ambient exposure, the inorganic oxide film 904 comprises a first inorganic layer 904A and a second inorganic layer 904B. In the illustrated embodiment, the second inorganic layer is formed over a major surface of the first inorganic layer. In a non-illustrated embodiment, the second inorganic layer may also be formed over the exposed edges (side surfaces) of the first inorganic layer. In order to evaluate the hermeticity of the inorganic oxide film, calcium patch test samples were placed into an oven and subjected to accelerated environmental aging at a fixed temperature and humidity, typically 85° C. and 85% relative humidity ("85/85 testing").

The hermeticity test optically monitors the appearance of the vacuum-deposited calcium layers. As-deposited, each calcium patch has a highly reflective metallic appearance. Upon exposure to water and/or oxygen, the calcium reacts and the reaction product is opaque, white and flaky. Survival of the calcium patch in the 85/85 oven over 1000 hours is equivalent to the encapsulated film surviving 5-10 years of ambient operation. The detection limit of the test is approximately $10^{-7}$ $g/m^2$ per day at 60° C. and 90% relative humidity.

Figure 11:
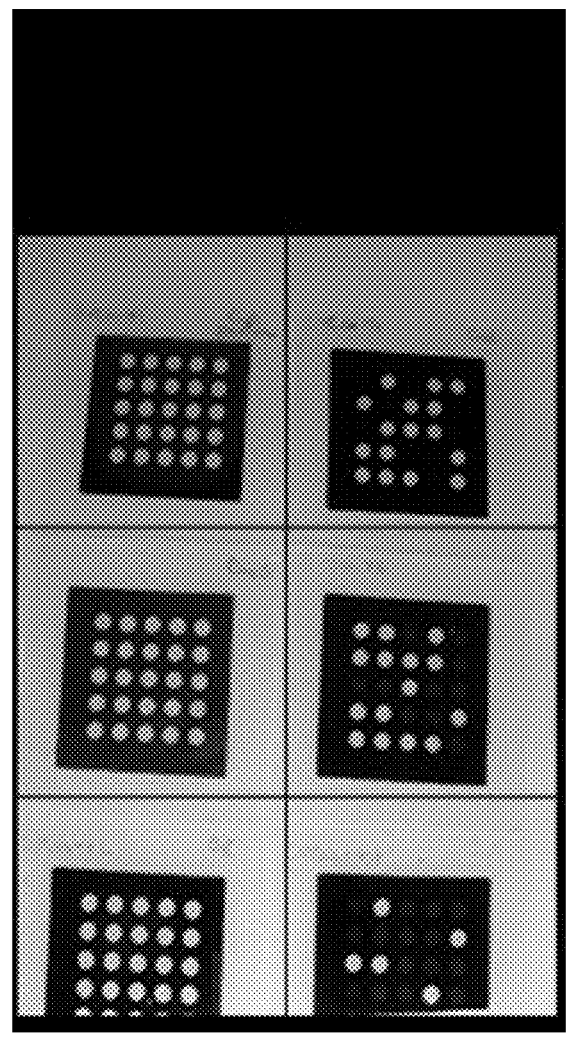
FIG. 11 shows test results for non-hermetically sealed (left) and hermetically sealed (right) calcium patches following accelerated testing.

FIG. 11 illustrates behavior typical of non-hermetically sealed and hermetically sealed calcium patches after exposure to the 85/85 accelerated aging test. In FIG. 11, the left column shows non-hermetic encapsulation behavior for $Cu_2O$ films formed directly over the patches. All of the $Cu_2O$-coated samples failed the accelerated testing, with catastrophic delamination of the calcium dot patches evidencing moisture penetration through the $Cu_2O$ layer. The right column shows positive test results for nearly 50% of the samples comprising a CuO-deposited hermetic layer. In the right column of samples, the metallic finish of 34 intact calcium dots (out of 75 test samples) is evident.

Figure 12:
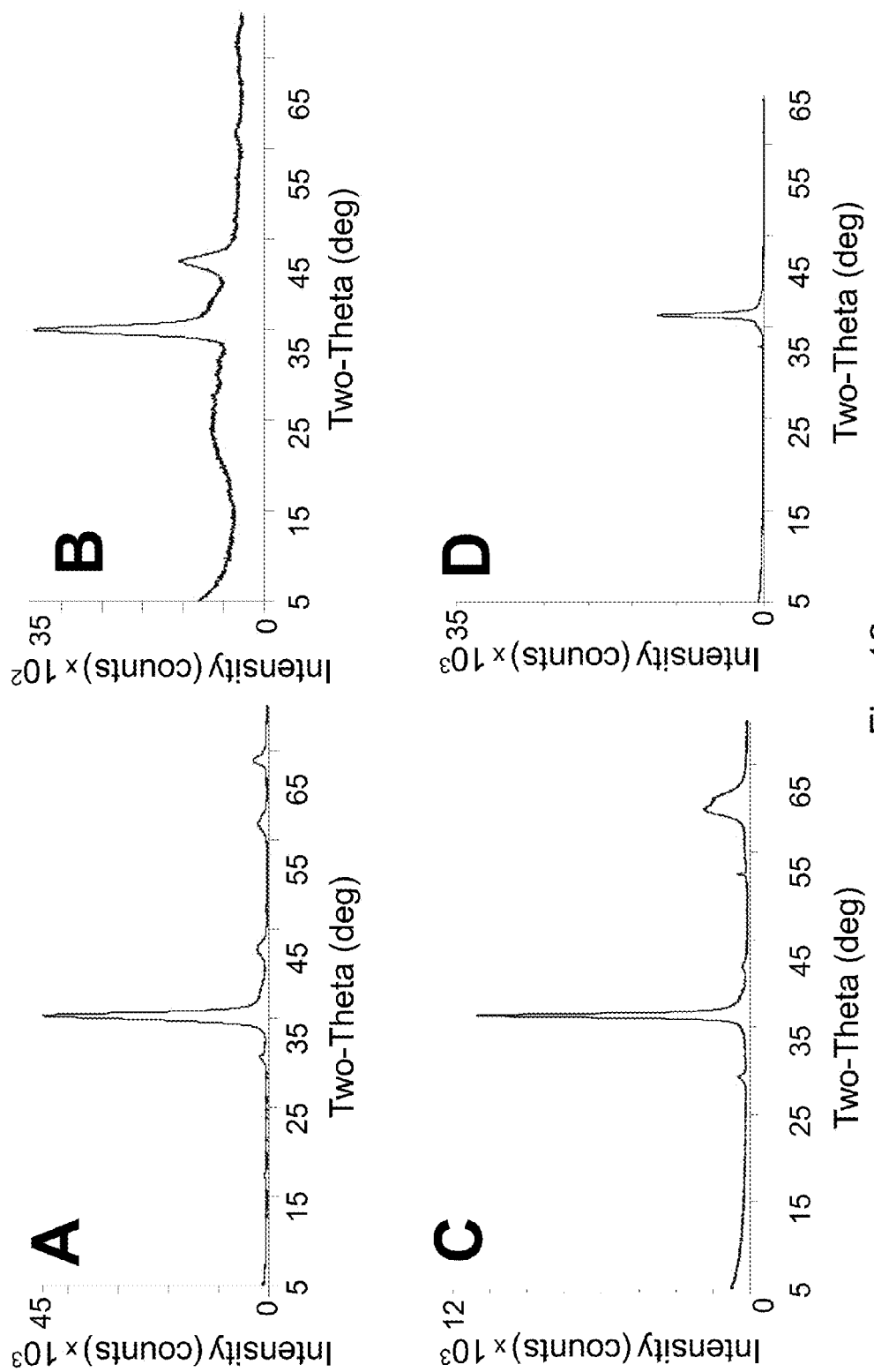
FIG. 12 shows glancing angle (A,C) and thin film (B,D) x-ray diffraction (XRD) spectra for a hermetic CuO-based barrier layer-forming material (top series) and a non-hermetic $Cu_2O$-based barrier layer forming material (bottom series)

Both glancing angle x-ray diffraction (GIXRD) and traditional powder x-ray diffraction were used to evaluate the near surface and entire oxide layer, respectively, for both non-hermetic and hermetic deposited layers. FIG. 12 shows GIXRD data (plots A and C) and traditional powder reflections (plots B and D) for both hermetic CuO-deposited layers (plots A and B) and non-hermetic $Cu_2O$-deposited layers (plots C and D). Typically, the 1 degree glancing angle used to generate the GIXRD scans of FIGS. 12A and 4C probes a near-surface depth of approximately 50-300 nanometers.

Referring still to FIG. 12, the hermetic CuO-deposited film (plot A) exhibits near surface reflections that index to the phase paramelaconite ($Cu_4O_3$), though the interior of the deposited film (plot B) exhibits reflections consistent with a significant amorphous copper oxide content. The paramelaconite layer corresponds to the second inorganic layer, which formed from the first inorganic layer (CuO) that was formed directly over the calcium patches. In contrast, the non-hermetic $Cu_2O$-deposited layer exhibits x-ray reflections in both scans consistent with $Cu_2O$.

The XRD results suggest that hermetic films exhibit a significant and cooperative reaction of the sputtered (as-deposited) material with heated moisture in the near surface region only, while non-hermetic films react with heated moisture in their entirety yielding significant diffusion channels which preclude effective hermeticity. For the copper oxide system, the hermetic film data (deposited CuO) suggest that paramelaconite crystallite layer forms atop an amorphous base of un-reacted sputtered CuO, thus forming a mechanically stable and hermetic composite layer.

Figure 13:
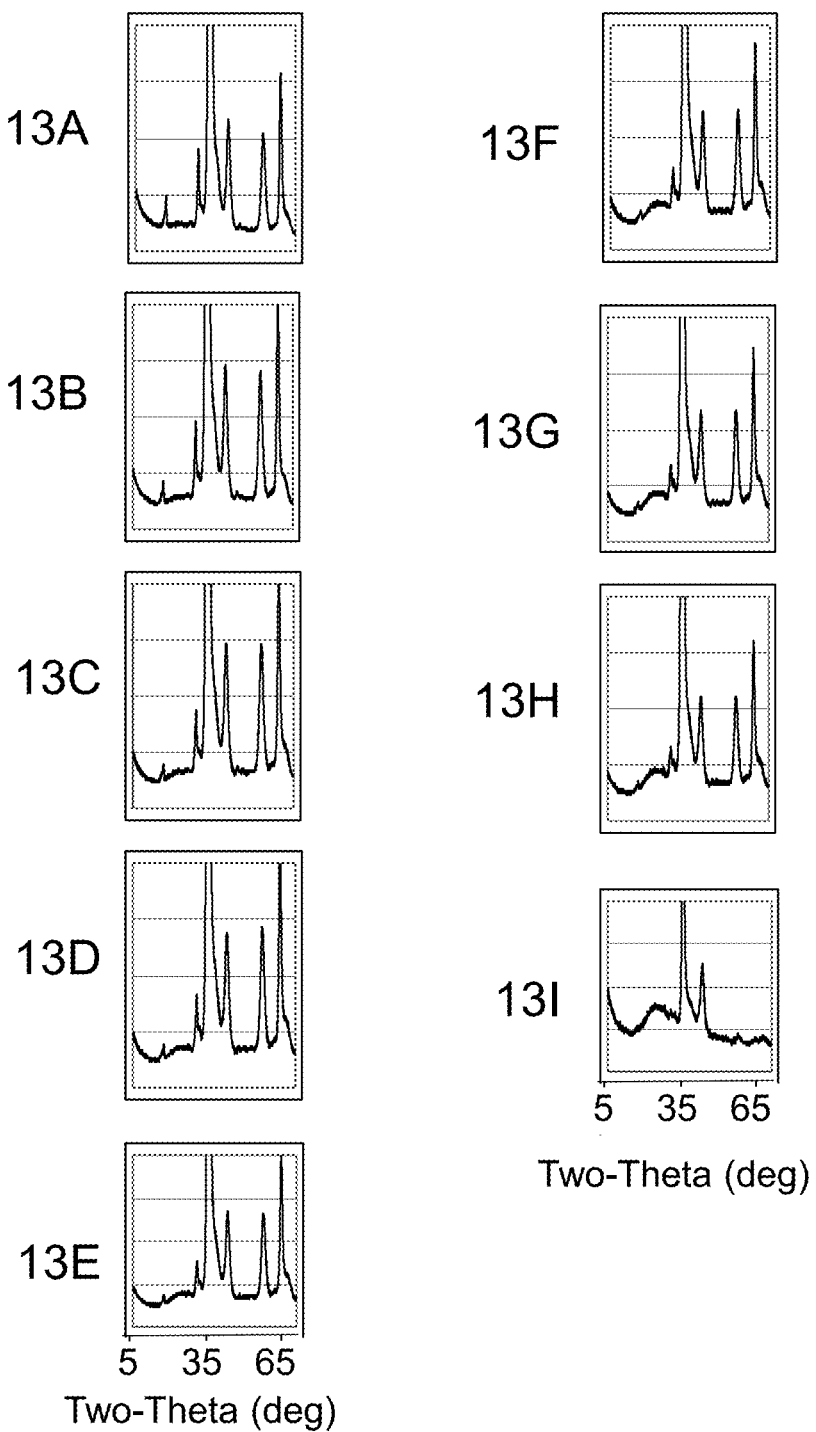
FIGS. 13A-13I show a series of glancing angle XRD spectra for hermetic CuO-based barrier layers following accelerated testing.

FIGS. 13A-13H show a series of GIXRD plots, and FIG. 13I shows a Bragg XRD spectrum for a CuO-deposited hermetic barrier layers following accelerated testing. Bragg diffraction from the entire film volume has an amorphous character, with the paramelaconite phase present at/near the film's surface. Using a CuO density of 6.31 g/cm$^3$, a mass attenuation coefficient of 44.65 cm$^2$/g, and an attenuation coefficient of 281.761 cm$^{-1}$, the paramelaconite depth was estimated from the GIXRD plots of FIG. 13. In FIGS. 13A-13H, successive glancing incident x-ray diffraction spectra obtained at respective incident angles of 1°, 1.5°, 2°, 2.5°, 3.0°, 3.5°, 4°, and 4.5° show a surface layer (paramelaconite) that comprises between 31% (619 nm) and 46% (929 nm) of the original 2 microns of sputtered CuO after exposure to 85° C. and 85% relative humidity for 1092 hours. A summary of the calculated surface depth (probed depth) for each GIXRD angle is shown in Table 1.

TABLE 1

| | Paramelaconite depth profile | |
|---|---|---|
| Figure | GIXRD angle (degrees) | Probed Depth (nm) |
| 13A | 1 | 300 |
| 13B | 1.5 | 465 |
| 13C | 2 | 619 |
| 13D | 2.5 | 774 |
| 13E | 3 | 929 |
| 13F | 3.5 | 1083 |
| 13G | 4 | 1238 |

TABLE 1-continued

| | Paramelaconite depth profile | |
|---|---|---|
| Figure | GIXRD angle (degrees) | Probed Depth (nm) |
| 13H | 4.5 | 1392 |
| 13I | n/a | 2000 |

Figure 14:
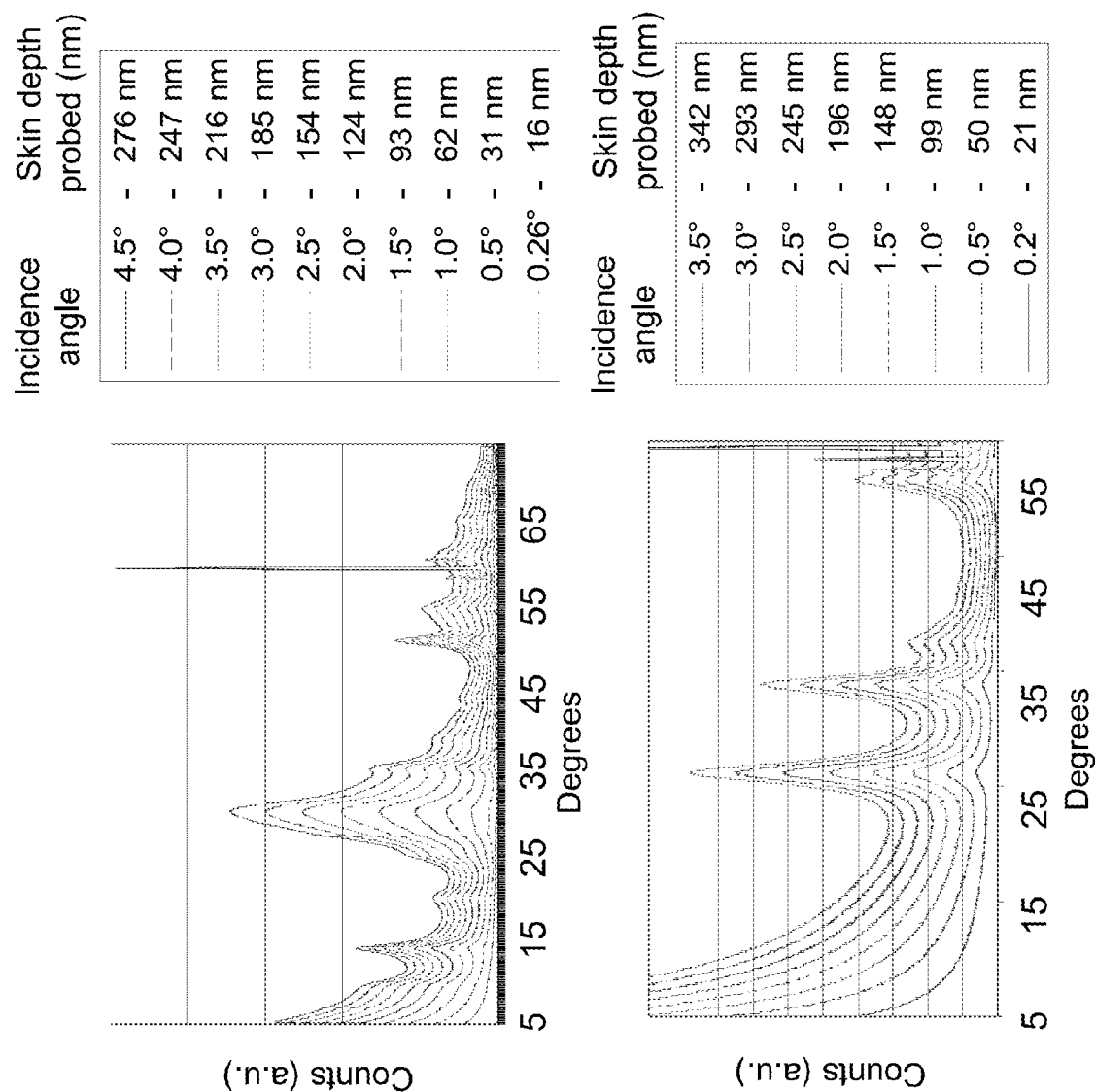
FIG. 14 is a series of glancing angle XRD spectra for hermetic SnO-based barrier layers (top) and non-hermetic $SnO_2$-based barrier layers (bottom) following accelerated testing.

In addition to the hermeticity evaluations conducted using copper oxide-based barrier layers, tin oxide-based barrier layers were also evaluated. As seen with reference to FIG. 14, which shows GIXRD spectra for SnO (top) and $SnO_2$-deposited films (bottom) after 85/85 exposure, the hermetic thin film (top) exhibits a crystalline $SnO_2$-like (passivation) layer that has formed over the deposited amorphous SnO layer, while the non-hermetic ($SnO_2$-deposited) film exhibits an entirely crystalline morphology.

Table 2 highlights the impact of volume change about the central metal ion on the contribution to film stress of the surface hydration products. It has been discovered that a narrow band corresponding to an approximate 15% or less increase in the molar volume change contributes to a hermetically-effective compressive force. In embodiments, a molar volume of the second inorganic layer is from about −1% to 15% (i.e., −1, 0, 1, 2, 3, 4, 5, 6, 7, 8, 9, 10, 11, 12, 13, 14 or 15%) greater than a molar volume of the first inorganic layer. The resulting self-sealing behavior (i.e., hermeticity) appears related to the volume expansion.

TABLE 2

| Calculated Molar Volume Change for Various Materials | | | |
|---|---|---|---|
| Sputtering Target Material/First Inorganic Layer | Second Inorganic Layer | Δ Molar Volume [%] | Hermetic Layer? |
| SnO | $SnO_2$ | 5.34 | yes |
| FeO | $Fe_2O_3$ † | 27.01 | no |
| $Sb_2O_3$ (senarmontite) | $Sb_2O_5$ † | 63.10 | no |
| $Sb_2O_3$ (valentinite) | $Sb_2O_5$ † | 67.05 | no |
| $Sb_2O_3$ (valentinite) | Sb + 3Sb + 5O$_4$ (cervantite) | −9.61 | no |
| $Sb_2O_3$ (valentinite) | $Sb_3O_6(OH)$ (stibiconite) † | −14.80 | no |
| $Ti_2O_3$ | $TiO_2$ † | 17.76 | no |
| $Cu_2O$ | $Cu^+_2Cu^{2+}_2O_3$ (paramelaconite) † | 12.30 | no |
| CuO | $Cu^+_2Cu^{2+}_2O_3$ (paramelaconite) | 0.97 | yes |

† estimate

Table 3 shows the hermetic-film-forming inorganic oxide was always the least thermodynamically stable oxide, as reflected in its Gibbs free energy of formation, for a given elemental pair. This suggests that as-deposited inorganic oxide films are metastable and thus potentially reactive towards hydrolysis and/or oxidation.

TABLE 3

| Gibbs Formation Free Energy ($\Delta G°_{formation}$) of Various Oxides | | |
|---|---|---|
| Target Material | $\Delta G°_{formation}$ [kJ/mol] | Hermetic Layer |
| SnO | −251.9 | yes |
| $SnO_2$ | −515.8 | no |
| CuO | −129.7 | yes |
| $Cu_2O$ | −146.0 | no |

In embodiments, the barrier layer can be derived from room temperature sputtering of one or more of the foregoing materials, though other thin film deposition techniques can be used. In order to accommodate various workpiece architectures, deposition masks can be used to produce a suitably patterned hermetic barrier layer. Alternatively, conventional lithography and etching techniques can be used to form a patterned hermetic layer from a previously-deposited blanket layer.

To form hermetic barrier layers via sputtering, a sputtering target may comprise a low $T_g$ glass material or a precursor thereof, such as a pressed powder target where the powder constituents have an overall composition corresponding to the desired barrier layer composition. Glass-based sputtering targets may comprise a dense, single phase low $T_g$ glass material. Aspects of forming both glass composition sputtering targets and pressed powder sputtering targets are disclosed herein.

For both glass composition and pressed powder composition targets, a thermally-conductive backing plate such as a copper backing plate may be used to support the target material. The backing plate can have any suitable size and shape. In one example embodiment, a 3 inch outer diameter (OD) circular copper backing plate is formed from a 0.25 inch thick copper plate. A central area having a diameter of about 2.875 inch is milled from the plate to a depth of about 1/8 inch, leaving an approximately 1/16 inch wide lip around a peripheral edge of the central area. A photograph of such a copper backing plate is shown in FIG. 15.

To form a glass composition sputtering target according to one embodiment, the central area of the backing plate is initially coated with a thin layer of flux-less solder (Cerasolzer ECO-155). The solder provides an oxide-free, or substantially oxide-free, adhesion-promoting layer to which the target material can be bonded. An image of a solder-treated copper backing plate is shown in FIG. 16.

A desired glass composition can be prepared from raw starting materials. Starting materials to form a tin fluorophosphate glass, for example, can be mixed and melted to homogenize the glass. The raw materials, which can comprise powder materials, can be heated, for example, in a carbon crucible to a temperature in the range of 500-550° C., and then cast onto a graphite block to form a glass cullet. The cullet can be broken up, remelted (500-550° C.), and then poured into the central area of a pre-heated, solder-treated backing plate. The backing plate can be pre-heated to a temperature in the range of 100-125° C. The casting can be annealed at a temperature of 100-125° C. for 1 hour, though longer anneal times can be used for larger backing plates. An image of an as-annealed low $T_g$ glass sputtering target is shown in FIG. 17.

After the glass composition is annealed, the glass can be heat-pressed against the solder-coated copper, e.g., using a Carver press at a temperature of below 225° C., e.g., from 140-225° C. and an applied pressure of 2000-25,000 psi. The heat-pressing promotes thorough compaction and good adhesion of the glass material to the backing plate. In a further embodiment, the step of heat-pressing can be performed at a temperature of less than 180° C. An image of a pressed, low $T_g$ glass sputtering target is shown in FIG. 18.

By controlling the temperature and pressure used to anneal and compress the glass target, the formation of unwanted voids or secondary phases can be minimized or avoided. In accordance with various embodiments, a sputtering target comprising a low $T_g$ glass material can have a density approaching or equal to the theoretical density of the glass material. Example target materials include glass material having a density greater than 95% of a theoretical density of the material (e.g., at least 96, 97, 98, or 99% dense).

By providing dense sputtering targets, degradation of the target during use can be minimized. For instance, the exposed surface of a target that contains porosity or mixed phases may become preferentially sputtered and roughened during use as the porosity or second phase is exposed. This can result in a runaway degradation of the target surface. A roughened target surface may lead to flaking of particulate material from the target, which can lead to the incorporation of defects or particle occlusions in the deposited layer. A barrier layer comprising such defects may be susceptible to hermetic breakdown. Dense sputtering targets may also exhibit uniform thermal conductivity, which promotes non-destructive heating and cooling of the target material during operation.

According to various embodiments, methods for forming a sputtering target disclosed herein can be used to produce single phase, high density targets of a low $T_g$ glass composition. The glass targets can be free of secondary or impurity phases. While the foregoing relates to forming a sputtering target directly on a backing plate, it will be appreciated that a suitable glass-based target composition can be prepared independently from such a backing plate and then optionally incorporated onto a backing plate in a subsequent step.

Figure 19:
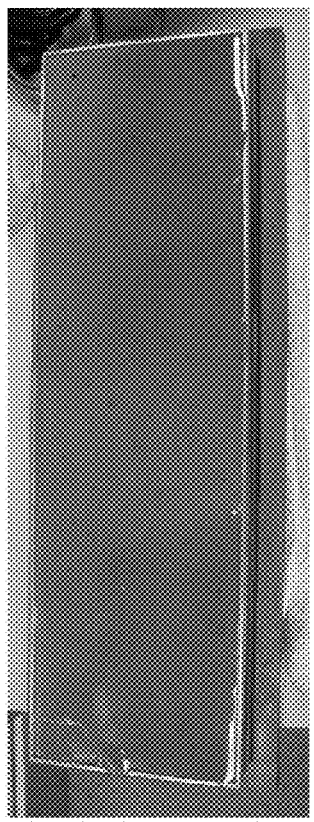
FIG. 19 shows a large form factor sputtering target prior to compressing.

In embodiments, a method of making a sputtering target comprising a low $T_g$ glass material comprises providing a mixture of raw material powders, heating the powder mixture to form a molten glass, cooling the glass to form a cullet, melting the cullet to form a glass melt, and shaping the glass melt into a solid sputtering target. FIG. 19 is an image showing the incorporation of glass material into the central area of larger form factor rectangular backing plate.

Figure 21:
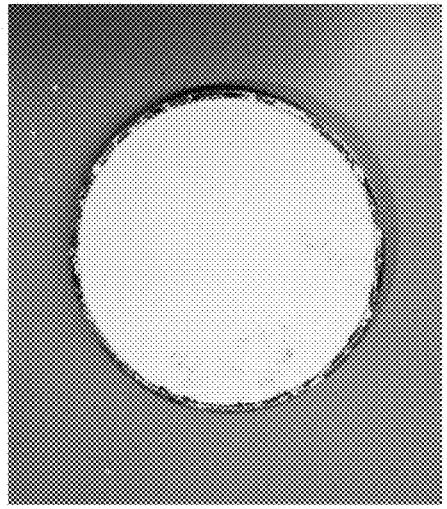
FIG. 21 shows the circular copper backing plate of FIG. 20 after compression of the loose powder.
Figure 20:
FIG. 20 shows a circular copper backing plate with loose powder material incorporated into a central area of the plate.

As an alternative to a glass material-based sputtering target, the steps of melting and homogenizing the starting raw materials can be omitted, and instead powder raw materials can be mixed and pressed directly into the central area of a suitable backing plate. FIG. 20 is an image showing the incorporation of powder raw materials into the central area of a circular backing plate, and FIG. 21 shows a final pressed-powder sputtering target after compression of the powder materials of FIG. 20.

A method of making a pressed-powder sputtering target comprising a powder compact having the composition of a low $T_g$ glass comprises providing a mixture of raw material powders, and pressing the mixture into a solid sputtering target. In such an approach, the powder mixture is a precursor of a low $T_g$ glass material. In a related approach, a method of making a pressed-powder sputtering target comprising an oxide of copper or tin comprises providing a powder of CuO or SnO and pressing the powder into a solid sputtering target.

Hermetic barrier layers formed by sputtering may be optically transparent, which make them suitable for encapsulating, for example, food items, medical devices, and pharmaceutical materials, where the ability to view the package contents without opening the package may be advantageous. Optical transparency may also be useful in sealing opto-electronic devices such as displays and photovoltaic devices, which rely on light transmission. In embodiments, the hermetic barrier layers have an optical transparency characterized by an optical transmittance of greater than 90% (e.g., greater than 90, 92, 94, 96 or 98%).

In one further example embodiment, sputter-deposited hermetic barrier layers may be used to encapsulate a workpiece that contains a liquid or a gas. Such workpieces include dye-sensitized solar cells (DSSCs), electro-wetting displays, and electrophoretic displays. The disclosed hermetic barrier layers can substantially inhibit exposure of a workpiece to air and/or moisture, which can advantageously prevent undesired physical and/or chemical reactions such as oxidation, hydration, absorption or adsorption, sublimations, etc. as well as the attendant manifestations of such reactions, including spoilage, degradation, swelling, decreased functionality, etc.

Due to the hermeticity of the protective barrier layer, the lifetime of a protected workpiece can be extended beyond that achievable using conventional hermetic barrier layers. Other devices that can be protected using the disclosed materials and methods include organic LEDs, fluorophores, alkali metal electrodes, transparent conducting oxides, and quantum dots.

Disclosed are sputtering targets and methods for forming sputtering targets that comprise a low $T_g$ glass material or precursor thereof, or an oxide of copper or tin. Sputtering processes using the foregoing targets can be used to form self-passivating hermetic barrier layers.

As used herein, the singular forms "a," "an" and "the" include plural referents unless the context clearly dictates otherwise. Thus, for example, reference to a "glass" includes examples having two or more such "glasses" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

We claim:

1. A method of forming a hermetic barrier layer comprising:
providing a substrate and a sputtering target within a sputtering chamber, the sputtering target including a thermally conductive backing plate and a sputtering material selected from at least one of a low $T_g$ glass comprising tin oxide and having a glass transition temperature of less than about 400° C. or a precursor of the low $T_g$ glass;
maintaining the substrate at less than 200° C. during sputtering, wherein maintaining the substrate at less than 200° C. further comprises cooling the substrate to a temperature less than room temperature; and
forming a self-passivating barrier layer comprising the sputtering material over a surface of the substrate at a deposition rate of about 10 Å/sec or greater by actively cooling the sputtering target at less than about 200° C. while maintaining an internal pressure within the sputtering chamber to less than about $1 \times 10^{-3}$ Torr and sweeping the sputtering target with an ion beam at near normal incidence,
wherein the self-passivating barrier layer has a defect size distribution and defect density distribution less than a critical self-passivation threshold such that defect diffusion paths are sealed through molar volume expansion of less than 10% of the sputtering material when exposed to air.

2. The method according to claim 1, wherein the tin oxide comprises SnO.

3. The method according to claim 1, wherein the low $T_g$ glass is selected from the group consisting of tin phosphate, tin fluorophosphate, and tin fluoroborate glasses.

4. The method according to claim 3, wherein the low $T_g$ glass comprises:
20-100 mol% SnO;
0-50 mol% $SnF_2$; and
0-30 mol% $P_2O_5$ or $B_2O_3$.

5. The method according to claim 4, wherein the low $T_g$ glass further comprises at least one of:
0-10 mol% $WO_3$;
0-10 mol% $CeO_2$; and
0-5 mol% $Nb_2O_5$.

6. The method according to claim 1, wherein the low $T_g$ glass comprises:
35-50 mol% SnO;
30-40 mol% $SnF_2$;
15-25 mol% $P_2O_5$; and
1.5-3 mol% of at least one dopant oxide chosen from $WO_3$, $CeO_2$, and $Nb_2O_5$.

7. The method according to claim 1, wherein the sputtering material comprises a pressed powder of the low $T_g$ glass or low $T_g$ glass precursor.

8. The method according to claim 1, wherein the deposition rate of the barrier layer is dependent upon target distance from the substrate.

9. The method according to claim 1, wherein the defect size distribution and defect density distribution are dependent upon target distance from the substrate.

10. The method according to claim 1, wherein the sputtering target is rotated during the sputtering.

* * * * *